United States Patent [19]
Uomi et al.

[11] Patent Number: 4,894,835
[45] Date of Patent: Jan. 16, 1990

[54] SURFACE EMITTING TYPE SEMICONDUCTOR LASER

[75] Inventors: Kazuhisa Uomi, Hachioji; Shinji Tsuji, Saitama; Makoto Okai, Koganei; Shinji Sakano, Hachioji; Naoki Chinone, Chofu, all of Japan

[73] Assignee: Hitachi, Ltd., Tokyo, Japan

[21] Appl. No.: 249,870

[22] Filed: Sep. 27, 1988

[30] Foreign Application Priority Data

Sep. 30, 1987 [JP] Japan ................................ 62-243730

[51] Int. Cl.$^4$ ................................................ H01S 3/19
[52] U.S. Cl. ........................................ 372/45; 372/46; 372/50; 372/96
[58] Field of Search .................... 372/96, 43, 45, 46, 372/50

[56] References Cited
FOREIGN PATENT DOCUMENTS 0154517  1/1973  European Pat. Off. .
62172780 2/1971  Japan .
61191093 11/1978 Japan .
0138087  8/1983  Japan ................................ 372/96
0186083  9/1985  Japan ................................ 372/96

OTHER PUBLICATIONS

Scifres et al., "Highly Collimated laser beams for electrically pumped SH GaAs/GaAlAs distributed feedback laser," Appl. Phys. Letts, vol. 26, No. 2, Jan. 15, 1975, pp. 48–50.
"Surface Emitting GaAs/GaAlAs DFB-TJB Laser", by K. Mitsunaga, et al., The Institute of Electronics and Communication Engineers of Japan, Technical Digest, OQE 86-152, pp. 47–53.
Kojima, et al., "Continuous Wave Operation of a Surface-Emitting AlGaAs/GaAs Multiquantum Well Distributed Bragg Reflector Laser", Applied Physics Letters, vol. 50, No. 24, Jun. 15, 1987, pp. 1705–1707.
Macomber, et al., "Surface-Emitting Distributed Feedback Semiconductor Laser", Applied Physics Letters, vol. 51, No. 7, Aug. 17, 1987, pp. 472–474.
Carlson, et al., "Phase-Locked Operation of a Grating-Surface-Emitting Diode Laser Array", Applied Physics Letters, vol. 50, No. 19, May 11, 1987, pp. 1301–1303.

Primary Examiner—William L. Sikes
Assistant Examiner—Georgia Y. Epps
Attorney, Agent, or Firm—Fay, Sharpe, Beall, Fagan, Minnich & McKee

[57] ABSTRACT

A surface emitting laser diode having a two-dimensionally extended light emitting region is disclosed in which the light emitting region includes a plurality of stripe regions and gap regions each formed between adjacent stripe regions, the stripe regions are optically coupled with each other through the gap regions, and an even-order diffraction grating is formed in at least a part of the light emitting area. The laser diode having the above structure can emit a high-intensity, well-collimated laser beam.

12 Claims, 6 Drawing Sheets

FIG. IA
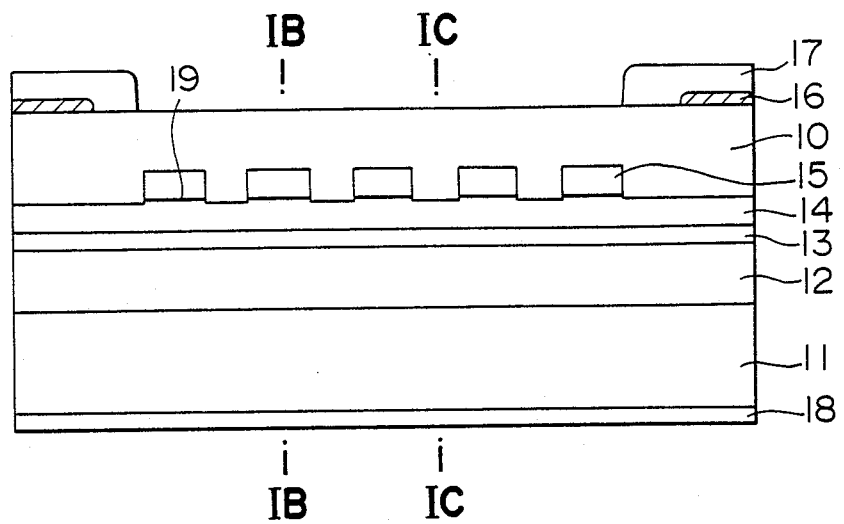
FIG. IB
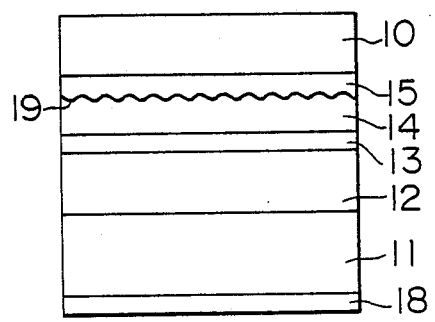
FIG. IC
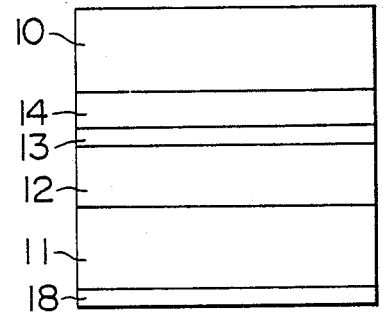

SURFACE EMITTING TYPE SEMICONDUCTOR LASER

BACKGROUND OF THE INVENTION

The present invention relates to a laser diode of the surface emitting type, and more particularly to a laser diode suitable for use in technical fields such as optical communication, optical recording or regeneration, optical interconnection and optical measurement. In other words, the present invention relates to a laser diode which can be used as the light sources of an optical communication system, a laser beam printer, an optical disk apparatus, an optical gyroscope, and others.

A laser diode includes not only an edge emitting laser diode which is usually used, but also a surface emitting diode which emits a laser beam in a direction perpendicular to the upper surface of a diode chip. An example of the surface emitting laser diode is described in, for example, an article entitled "Surface Emitting GaAs/GaAlAs DFB-TJB Laser" by K. Mitsunaga et al. (The Institute of Electronics and Communication Engineers of Japan, Technical digest, OQE 86-152).

In this laser diode, an optical guide layer having a second-order diffraction grating is formed between an active layer and an upper cladding layer, and a diffracted light from the grating due to the second-order Bragg reflection is subjected to distributed feedback, to generate laser oscillation. Simultaneously with the laser oscillation, a diffracted laser beam from the grating due to the first-order Bragg reflection is propagated in upward and downward directions perpendicular to the chip of the laser diode, and is taken out through a groove which is formed in a cap layer in accordance with the shape of a light emitting area. Accordingly, the groove is provided in the form of a stripe which is extended along the axial direction of a resonant cavity.

The far-field pattern of a laser beam which is emitted in an upward direction perpendicular to the chip of the laser diode, is as follows.

(1) As to the spread of the laser beam in a direction parallel to the axial direction of the resonant cavity, light rays with the same phase are emitted from an aperture corresponding to the length of resonant cavity (for example, aperture having a length of 300 μm), and hence the spread of the laser beam due to diffraction is very small. For example, the half-intensity angle of the intensity distribution of the laser beam is about 0.2°. That is, the laser beam is well collimated in the direction parallel to the axial direction of the resonant cavity.

(2) As to the spread of the laser beam in a direction perpendicular to the axial direction of the resonant cavity, light existing in the active layer and optical guide layer are confined in a narrow region having a width of 2 to 3 μm, and hence the spread of the laser beam in the above direction due to diffraction is very large. For example, the half-intensity angle of the intensity distribution of the laser beam is about 12°. In other words, the laser beam has the form of a fan when viewed in a direction parallel to the axial direction of the resonant cavity.

As mentioned above, the laser beam emitted in an upward direction perpendicular to the chip of the laser diode has the intensity distribution shown in FIG. 5A, that is, has asymmetric intensity distribution. That is, in a surface emitting laser diode having the above-mentioned structure, there arises a problem that the laser beam emitted from the surface emitting laser diode is well collimated in a direction parallel to the axial direction of the resonant cavity, but the spread of the laser beam in a direction perpendicular to the axial direction of the resonant cavity is large.

SUMMARY OF THE INVENTION

It is therefore an object of the present invention to provide a surface emitting laser diode capable of emitting a laser beam which is well collimated not only in a direction parallel to the axial direction of a resonant cavity but also in a direction perpendicular to the axial direction of the resonant cavity.

In order to attain the above object, in accordance with one aspect of the present invention, there is provided a surface emitting laser diode whose light emitting region is enlarged in a direction perpendicular to the axial direction of a resonant cavity. The enlarged light emitting region, that is, a two-dimensional light emitting region includes a plurality of sub-emitting regions, and each of the sub-emitting region has the form of a stripe extended along the axial direction of the resonant cavity. Accordingly, the sub-emitting region will hereinafter be referred to as "stripe region". The stripe regions are optically coupled with each other, to form the light emitting region with the same phase.

In accordance with a limited aspect of the present invention, there is provided a surface emitting laser diode, in which a 2N-th order diffraction grating (where N is an integer), that is, an even-order diffraction grating is formed in at least a part of the light emitting region. The diffraction grating may be formed only in stripe regions, only in gap regions, or all over the light emitting region. In a case where the diffraction grating is formed only in the stripe regions, in order to generate laser oscillation of a single transverse mode in which the laser light of each stripe have the phase, it is necessary to optically couple the stripe regions with each other so that the degree of coupling exceeds a predetermined value. In this case, it is required to put the width of a gap region in a range from 1 to 8 μm, and it is desirable to make the width of the gap region less than 5 μm, preferably less than 3 μm. Further, it is desirable to put the width of a stripe region in a range from 1 to 10 μm.

In accordance with a more limited aspect of the present invention, there is provided a surface emitting laser diode, in which an even-order diffraction grating is formed in a gap region existing between adjacent stripe regions. A diffracted wave from the grating due to Bragg reflection is emitted, as a laser beam, from the upper or lower surface of a laser chip. When the light intensity in the gap region is increased, the stability of the laser oscillation having a single transverse mode is improved. In order to improve the stability of such laser oscillation, it is desirable to provide electrodes for injecting currents into gap regions, at positions corresponding to the gap regions, thereby increasing the currents injected into the gap regions, or to make small the distance between adjacent stripe regions, thereby improving the optical coupling of stripe regions.

In accordance with another aspect of the present invention, there is provided a semiconductor laser device, in which a plurality of semiconductor layers are stacked on a substrate, the stacked semiconductor layers include an active layer for emitting light and an optical guide layer for guiding the light, and a light emitting region including a plurality of stripe regions and gap regions each provided between adjacent stripe regions are formed in the stacked semiconductor layers so that the stripe regions are optically coupled with each other through the gap regions. The refractive index of stripe regions are larger than that of the gap regions. Accordingly, a greater part of light radiating from the active layer exists in the stripe regions. That is, the light intensity in the stripe regions is far larger than that in the gap regions.

One advantage of the present invention resides in that a semiconductor laser is obtained which has a large output power and can emit a well-collimated laser beam.

Another advantage of the present invention resides in that a laser beam can be obtained which is two-dimensionally collimated on a plane perpendicular to the emitting direction of the laser beam.

Other advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts or in various steps and arrangements of steps. The drawings are only for purposes of illustrating the preferred embodiments and are not to be construed as limiting the invention.

FIG. 1 is a sectional view showing an embodiment of a semiconductor laser according to the present invention.

FIG. 1B is a sectional view taken along the line IB—IB of FIG. 1A.

FIG. 1C is a sectional view taken along the line IC—IC of FIG. 1A.

DESCRIPTION OF THE PREFERRED EMBODIMENTS

In order to attain an object which has been already described, a surface emitting laser diode according to the present invention has a large light emitting region, which is made up of a plurality of stripe regions and gap regions each provided between adjacent stripe regions.

In a conventional semiconductor laser, a light emitting region has the form of a stripe which is long in the axial direction of a resonant cavity and is very short in a direction perpendicular to the axial direction of the resonant cavity.

Figure 6A:
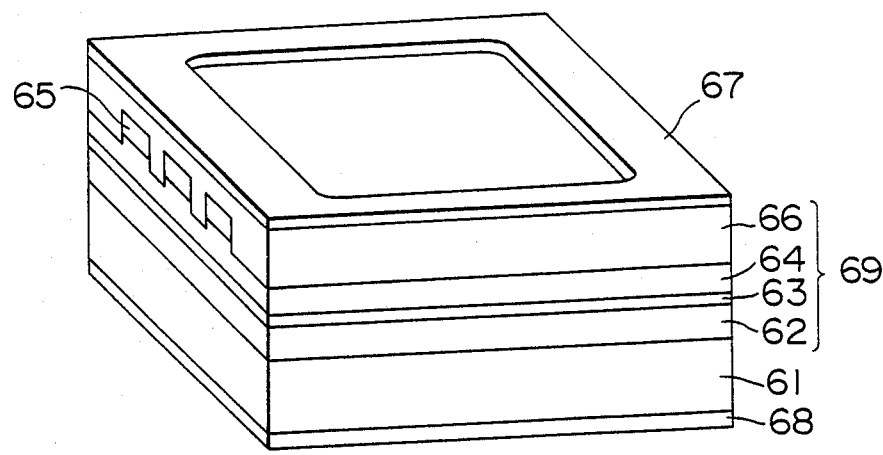
FIG. 6A is a perspective view showing the fundamental construction of a semiconductor laser according to the present invention.

In a semiconductor laser according to the present invention, a plurality of stripe regions are formed side by side, to realize a large light emitting region with two dimension. FIG. 6A shows the fundamental construction of such a semiconductor laser, and shows the semiconductor laser viewed obliquely from above the semiconductor laser. In this semiconductor laser, a window for emitting a laser beam is provided on the upper surface of a semiconductor laser chip, and thus the laser beam is emitted in an upward direction. Referring to FIG. 6A, a laminated semiconductor structure 69 is formed on a substrate 61, and includes cladding layers 62 and 64 opposite in conductivity type to each other and an active layer 63 sandwiched between the cladding layers 62 and 64. Further, a negative or positive electrode 67 and a positive or negative electrode 68 are formed as shown in FIG. 6A. It is to be noted that the electrode 67 on the light emitting side is provided with a window corresponding to a light emitting region. However, the electrode 67 is not always required to have the window, but may be made of a transparent material. Further, the form of the window is not limited to that shown in FIG. 6A, but the window may have a desired form.

Figure 6B:
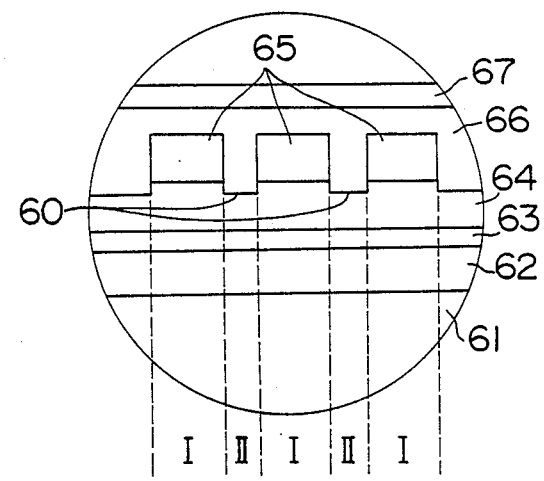
FIG. 6B is an enlarged view showing a part of an end surface of the semiconductor laser shown in FIG. 6A.

FIG. 6B is an enlarged view showing a part of an end surface of the semiconductor laser of FIG. 6A. In FIGS. 6A and 6B, like reference numerals designated like parts. Referring to FIG. 6B, all the regions designated by reference symbols I and II constitute the light emitting region of the semiconductor laser. That is, the light emitting region is made up of a plurality of stripe regions I and gap regions II each formed between adjacent stripe regions. A laser beam is taken out of the light emitting region in a direction perpendicular to a plane, on which the stripe regions I and the gap regions II are arranged. Each stripe region I includes an optical guide layer 65 for guiding light which is emitted from the active layer 63. The laser beam passing through a window which is provided on the upper surface of the semiconductor laser, includes light generating from the stripe regions I and light generating from the gap regions II. Hence, the stripe regions I and the gap regions II are luminous when viewed from outside. An important feature of a semiconductor laser according to the present invention resides in that a 2N-th order diffraction grating is formed in at least a part of the light emitting region. For example, the diffraction grating is formed in those surface areas 60 of the cladding layer 64 of FIG. 6B which are included in the gap regions II. Alternatively, the diffraction grating may be formed in each of the stripe regions I.

When the 2N-th order diffraction grating (where N is an integer) is formed in the light emitting region, a laser beam can be emitted in the following manner.

The Bragg reflection of laser light, that is, distributed feedback for laser light is caused by the 2N-th order Fourier component of the grating and the output coupling of laser light to upward or downward direction is caused by the Nth order Fourier component of the grating.

According to the present invention, the light emitting region is two-dimensionally enlarged, and hence the spread of the laser beam due to diffraction is very small with two dimension.

Further, when a plurality of stripe regions are formed in a light emitting region in accordance with the present invention, a plurality of transverse modes may occur. However, as to a fundamental transverse mode having the same phase of lasing mode in the stripe regions, the degree of optical coupling of the stripe regions is largest, and the light intensity in the gap regions is relatively large. Accordingly, when a diffraction grating for distributed feedback is formed, for example, only in the gap regions, the threshold gain for the above transverse mode is reduced, and thus the fundamental transverse mode is readily generated. When the fundamental transverse mode is taken out of the light emitting region by utilizing a lower-order Bragg reflection at the grating, a laser beam is emitted from an area of tens of microns by hundreds of microns, and thus a two-dimensionally collimated beam can be obtained.

Further, when a current injected into each gap region is increased, a fundamental transverse mode having a large light intensity in the gap regions is generated, that is, the area of a light emitting portion having the same phase of lasing mode is two-dimensionally enlarged.

The fundamental transverse mode having the same phase in the light emitting reion can also be generated by making small the distance between adjacent stripe regions.

In a case where a laser beam is taken out on the basis of Bragg reflection at the diffraction grating, it is necessary to make the electrode on the light emitting side of a conductive material permeable to the laser beam or to form a window corresponding to the light emitting region, in the above electrode.

Figure 7:
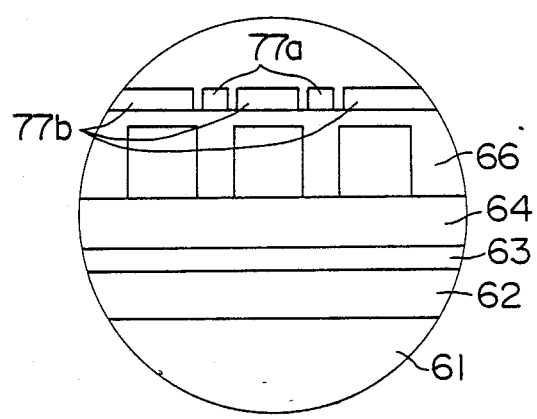
FIG. 7 is a schematic view showing a modified version of the structure of FIG. 6B.

Further, as shown in FIG. 7, an electrode 77a corresponding to each gap region II and an electrode 77b corresponding to each stripe region may be formed in place of the electrode 67. In this case, a current injected into each gap portion can be made different from a current injected into each stripe region, and thus stable laser oscillation of a single transverse mode can be readily obtained It is to be noted that in FIGS. 6B and 7, like reference numerals designate like parts.

Now, the present invention will be explained below in detail, on the basis of embodiments thereof.

EMBODIMENT 1

FIG. 1A is a sectional view which shows an embodiment of a semiconductor laser according to the present invention, and is taken along a plane perpendicular to the lengthwise direction of each stripe region of the embodiment. FIG. 1B is a sectional view taken along the line IB—IB of FIG. 1A, and FIG. 1C is a sectional view taken along the line IC—IC of FIG. 1A. Referring to FIGS. 1A, 1B and 1C, an n-cladding layer 12, an active layer 13 and a p-cladding layer 14 are piled on an n-semiconductor substrate 11. The active layer 13 is larger in refractive index and smaller in band gap than the cladding layers 12 and 14. Next, a diffraction grating 19 for generating the second-order Bragg reflection is formed in the surface of the p-cladding layer 14. In a case where a GaAlAs laser is constructed, the grating constant of the grating 19 is put in a range from 230 to 255 nm. In a case where an 1.55 $\mu$m InGaAsP laser is constructed, the grating constant of the grating 19 is made nearly equal to 480 nm. Thereafter, an n-optical guide layer 15 which is smaller in refractive index than the active layer 13 and is larger in refractive index than the p-cladding layer 14, is formed on the p-cladding layer 14. Then, those portions of the optical guide layer 15 which correspond to gap regions, are completely etched off, to form a plurality of stripe regions of the optical guide layer 15 as shown in FIG. 1A. FIG. 1A shows a case where five stripe regions are formed. In the above etching operation, those portions of the diffraction grating 19 formed on the p-cladding layer 14 which are included in the gap regions, are removed. The width of each stripe region and the distance between adjacent stripe regions are determined so that the stripe regions are optically coupled with each other. In a typical example, the width of stripe region is put in a range from 1 to 10 $\mu$m and the distance between adjacent stripe regions is put in a range from 1 to 8 $\mu$m. Thereafter, a p-cladding layer 10 smaller in refractive index than the optical guide layer 15 is grown so as to bury the optical guide layer 15 in the cladding layer 10. Then, an insulating film 16 is formed on the cladding layer 10 in order to limit the current into the stripe and gap regions. Further, a positive electrode 17 is formed on that area of the light emitting surface which does not correspond to the light emitting region, and a negative electrode 18 is formed on the surface of the substrate 11. Finally, the structure thus obtained is cut out so that the resonant cavity has a length of 300 to 600 $\mu$m.

In the present embodiment, each stripe region formed of the n-optical guide layer 15 is larger in refractive index than each gap region. Further, an n-p-n structure is formed at the stripe region, and hence it is hard to cause a current to flow through the stripe region. Accordingly, a greater part of a current supplied to the stripe regions flows into the gap regions, and hence a fundamental transverse mode having the same phase of lasing mode in the stripe regions is stably generated.

Figure 5A:
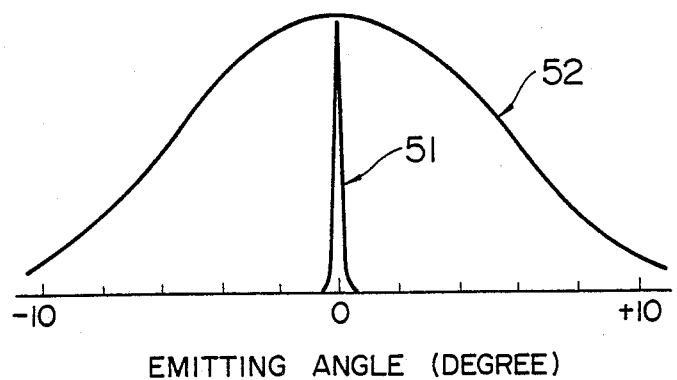
FIG. 5A is a graph showing the intensity distribution of the laser beam emitted from a conventional semiconductor laser.
Figure 5B:
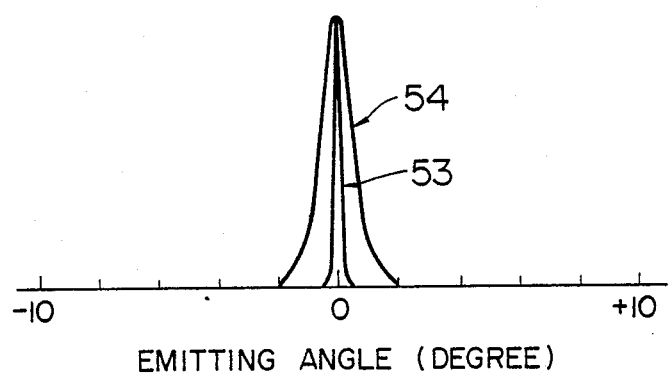
FIG. 5B is a graph showing the intensity distribution of the laser beam emitted from a semiconductor laser according to the present invention.

A semiconductor laser according to the present embodiment was fabricated. In the semiconductor laser, laser oscillation was generated on the basis of the distributed feedback of light due to the second-order Bragg reflection at the grating, and a laser beam was emitted in a direction perpendicular to the active layer on the basis of the first-order Bragg reflection at the grating. Further, it was confirmed that the laser beam having the same phase of lasing mode in the whole region of the resonant cavity in the axial direction thereof and in all the stripe regions was emitted from the semiconductor laser, that is, the above laser beam was emitted from an area of tens of microns by hundreds of microns. FIG. 5B shows the intensity distribution of the laser beam. In FIG. 5B, a curve 53 indicates the intensity distribution in a direction perpendicular to the grooves of the diffraction grating, and has a half-intensity angle of 0.1 to 0.2°. This value corresponds to diffraction limit which is determined by the laser beam determined by the length of the resonant cavity. Further, a curve 54 in FIG. 5B indicates the intensity distribution in a direction parallel to the grooves of the diffraction grating, and has a half-intensity angle of 0.5 to 1.5°. This value corresponds to diffraction limit which is determined by the laser beam determined by the total width of the stripe regions.

As mentioned above, according to the present embodiment, a two-dimensionally collimated laser beam can be obtained. Further, the present embodiment is large in light emitting area, and thus can produce a light output of 500 to 1,000 mW.

EMBODIMENT II

Figure 2A:
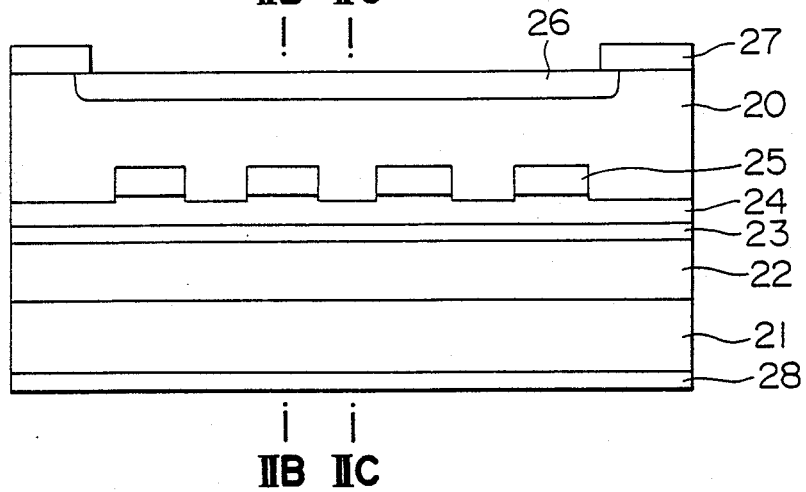
FIG. 2A is a sectional view showing another embodiment of a semiconductor laser according to the present invention.
Figure 2B:
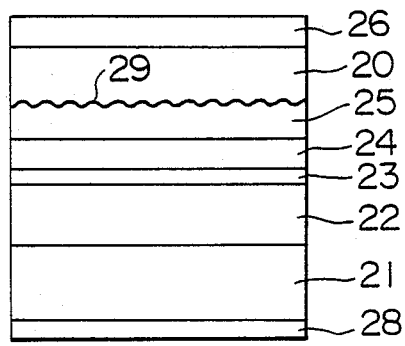
FIG. 2B is a sectional view taken along the line IIB—IIB of FIG. 2A.

FIG. 2A is a sectional view showing another embodiment of a semiconductor laser according to the present invention. FIG. 2B is a sectional view taken along the line IIB—IIB of FIG. 2A, and FIG. 2C is a sectional view taken along the line IIC—IIC of FIG. 2.

Figure 2C:
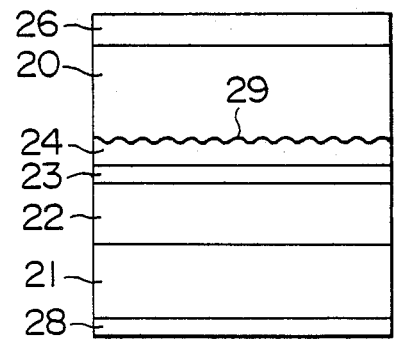
FIG. 2C is a sectional view taken along the line IIC—IIC of FIG. 2A.

Referring to FIGS. 2A, 2B and 2C, an n-cladding layer 22, an active layer 23 and a p-cladding layer 24 are piled on an n-semiconductor substrate 21, as in the EMBODIMENT I. Then, a p-optical guide layer 25 which is smaller in refractive index than the active layer 23 and is larger in refractive index than the p-cladding layer 24, is formed on the p-cladding layer 24. Then, those portions of the optical guide layer 25 which correspond to gap regions, are completely etched off so that the surface of the p-cladding layer 24 is exposed. Thus, a plurality of stripe regions (that is, four stripe regions) are formed of the optical guide layer 25. The width of each stripe region and the distance between adjacent stripe regions are made equal to values mentioned in the EMBODIMENT I. Then, a diffraction grating 29 for generating the fourth-order Bragg reflection is formed on the surface of the structure thus obtained, as shown in FIGS. 2B and 2C. Thereafter, a p-cladding layer 20 for burying the optical guide layer 25 therein is grown, and a current path 26 is formed in the p-cladding layer 20 by diffusing a p-type impurity into the cladding layer 20. Further, a positive electrode 27 and a negative electrode 28 are formed as shown in FIG. 2A. In the present embodiment, the diffraction grating 29 is formed all over a light emitting region, though a desired function can be performed by forming the diffraction grating 29 only in the gap regions. The diffraction grating 29 in the stripe regions is formed on the optical guide layer 25 as shown in FIG. 2B, and hence is spaced apart from the active layer 23. Accordingly, the diffraction grating in the stripe regions has no effect on the distributed feedback of light which is generated in the active layer 23. In other words, the distributed feedback of the above light is carried out by the diffraction grating 29 in the gap regions (that is, the grating shown in FIG. 2C). Accordingly, an oscillation mode having a large light intensity in the gap regions is generated. Since laser oscillation is generated on the basis of the distributed feedback of a diffracted wave due to the fourth-order Bragg reflection, a laser beam is emitted in a direction perpendicular to the active layer, on the basis of the first- or second-order Bragg reflection at the diffraction grating. A semiconductor laser according to the present embodiment was fabricated, and it was confirmed that the laser beam emitted from the semiconductor laser was able to have the same intensity distribution and power as mentioned in the EMBODIMENT I.

EMBODIMENT III

Figure 3A:
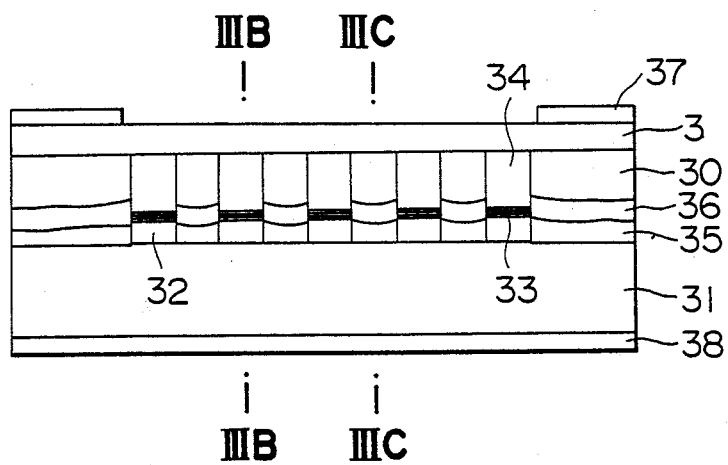
FIG. 3A is a sectional view showing a further embodiment of a semiconductor laser according to the present invention which embodiment includes an MQW (multi-quantum well) active layer.
Figure 3B:
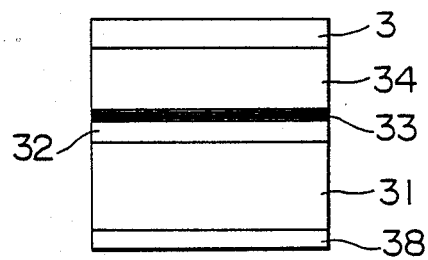
FIG. 3B is a sectional view taken along the line IIIA—IIIA of FIG. 3A.

Now, explanation will be made of a further embodiment of a semiconductor laser according to the present invention which embodiment is a GaAlAs laser having an MQW (multi-quantum well) active layer and a buried stripe structure, with reference to FIGS. 3A, 3B and 3C. FIG. 3A is a sectional view showing the present embodiment. FIG. 3B is a sectional view taken along the line IIIB—IIIB of FIG. 3A, and FIG. 3C is a sectional view taken along the line IIIC—IIIC of FIG. 3A.

Figure 3C:
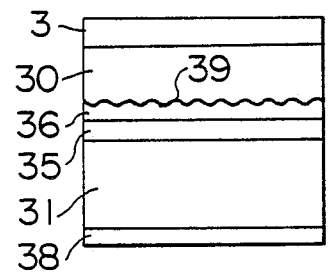
FIG. 3C is a sectional view taken along the line IIIB—IIIB of FIG. 3B.

Referring to FIGS. 3A, 3B and 3C, an n-GaAlAs cladding layer 32, a GaAs/GaAlAs MQW active layer 33 and a p-GaAlAs cladding layer 34 are piled on an n-GaAs substrate 31. Then, a plurality of stripe regions are formed so that each stripe region has a width of 1 $\mu$m and the distance between adjacent stripe regions is equal to 1 $\mu$m. In the present embodiment, the number of stripe regions is equal to five (5), as shown in FIG. 3A. Thereafter, a p-GaAlAs layer 35 and a p-GaAlAs optical guide layer 36 are successively formed. A diffraction grating 39 having a grating constant of 240 nm is formed on the optical guide layer 36, and then an n-GaAlAs layer 30 is grown. Thereafter, a p-GaAs contact layer 3 is formed all over the surface of this wafer, and then a positive electrode 37 provided with a window and a negative electrode 38 are formed as shown in FIG. 3A. Finally, the structure thus obtained is cut off by cleavage so that the resonant cavity has a length of 100 to 600 $\mu$m.

A semiconductor laser according to the present embodiment was fabricated, and it was confirmed that a well-collimated laser beam was emitted from the semiconductor laser in an upward direction. Further, the threshold current of the semiconductor laser was about one-half an ordinary threshold current, because the MQW active layer was used. The semiconductor laser was able to respond to a high frequency signal up to about 15 GHz by virtue of the quantum size effect. Further, in the semiconductor laser, a TE mode was readily generated, and moreover the stable plane of polarization was formed.

EMBODIMENT IV

Figure 4A:
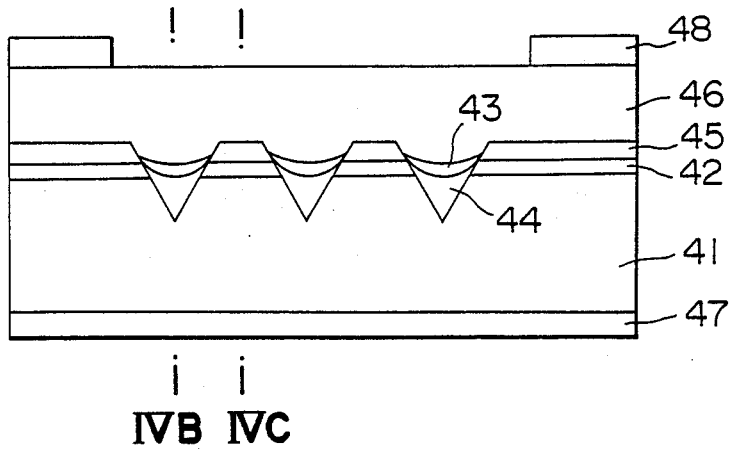
FIG. 4A is a sectional view showing still another embodiment of a semiconductor laser according to the present invention which embodiment includes a V-grooved structure.
Figure 4B:
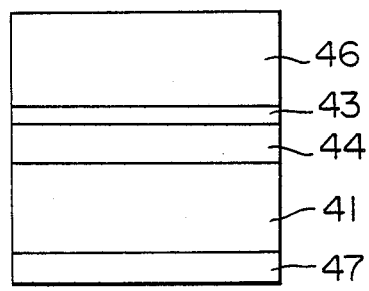
FIG. 4B is a sectional view taken along the line IVB—IVB of FIG. 4A.

FIG. 4A is a sectional view showing still another embodiment of a semiconductor laser according to the present invention. FIG. 4B is a sectional view taken along the line IVB—IVB of FIG. 4A, and FIG. 4C is a sectional view taken along the line IVC—IVC of FIG. 4A.

Figure 4C:
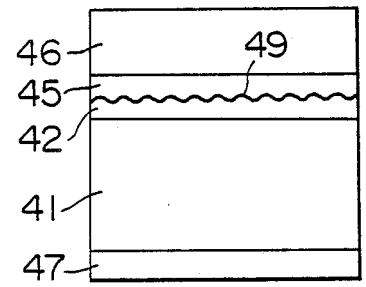
FIG. 4C is a sectional view taken along the line IVC—IVC of FIG. 4A.

Referring to FIGS. 4A and 4C, an n-InGaAsP optical guide layer 42 is grown on a p-InP substrate 41, and a second-order diffraction grating 49 is formed in the surface of the optical guide layer 42. Thereafter, a p-InP layer 45 is grown on the grating 49, and then three V-shaped grooves are formed as shown in FIG. 4A. Next, a p-InP layer 44, an InGaAsP active layer 43 and an n-InP layer 46 are successively grown by the liquid phase epitaxial growth method. Then, a negative electrode 48 provided with a window and a positive electrode 47 are formed.

A semiconductor laser according to the present embodiment was fabricated, and it was confirmed that the semiconductor laser was able to emit a well-collimated laser beam as in the semiconductor lasers mentioned in the EMBODIMENTS I to III. The present embodiment can emit a laser beam having a wavelength of 1.3 to 1.6 $\mu$m. Further, the present embodiment emits a thin laser beam, and hence can be readily coupled with an optical fiber for use in optical communication.

Although the present invention has been described with reference to a surface emitting laser diode which has a light emitting portion on the upper surface of the diode, it is to be appreciated that the present invention is also applicable to other types of surface emitting laser diodes which include a laser diode having a light emitting portion on the lower surface of the diode.

The invention has been described with reference to the preferred embodiments. Obviously, modifications and alterations can be readily made by those of ordinary skill in the art upon reading and understanding the present specification. It is intended that the invention be construed as including all such alterations and modifications in so far as they come within the scope of the appended claims or the equivalent thereof.

Specifically, it is to be appreciated that the present invention is applicable to all kinds of semi-conductor lasers capable of generating CW (continuous wave) oscillation, and is independent of the conductivity type of a semiconductor substrate.

We claim:

1. In a semiconductor laser of the surface emitting type comprising:
    a substrate; and
    a plurality of semiconductor layers stacked on the substrate, wherein the semiconductor layers include a light emitting region which has a plurality of strips regions and gap regions each placed between adjacent stripe regions, the stripe regions being optically coupled to each other through the gap regions, an active region which radiates light, and two semiconductor layers with smaller refractive indexes than the active region located above the below the active region; the light emitting region has 2N-th order gratings where N is an integer, wherein the grating is formed in at least one of the two layers above and below the active region.

2. The semiconductor laser as set forth in claim 1, wherein the gratings are formed at the gap regions.

3. The semiconductor laser as set forth in claim 1, wherein each of th stripe regions has an optical guide region in the vicinity of the active region for guiding the light radiated from the active layer.

4. The semiconductor laser as set forth in claim 1, wherein the gratings are formed in the stripe regions.

5. The semiconductor laser as set forth in claim 4, wherein the width of each stripe region lies in a range from 1 to 10 $\mu$m, and the width of each gap region lies in a range from 1 to 8 $\mu$m.

6. In a semiconductor laser comprising:
    a substrate;
    a plurality of semiconductor layers formed on the substrate, having an active layer which radiates light, wherein the semiconductor layers have stripe regions and gap regions each formed between adjacent stripe regions, the stripe regions guide the light, and the stripe regions are optically coupled each other, wherein the semiconductor layers include an active region and two semiconductor layers with smaller refractive indexes than the active layer and located above and below the active region; the light emitting region has 2N-th order grating where N is an integer, wherein the grating is formed in at least one of the two layers above and below the active region; and
    a pair of electrodes for injection carriers in the active layer so as to radiate the light, wherein at least one of the electrodes has a light emitting portion.

7. In a semiconductor laser comprising:
    a substrate;
    a plurality of semiconductor layers formed on the substrate, wherein the semiconductor layers have stripe regions and gap regions each formed between adjacent stripe regions, the stripe regions guide the light, and the stripe regions are optically coupled with each other, an active region which radiates light, and two semiconductor layers with smaller refractive indexes than the active region and located above and below the active region; the light emitting region has 2N-th order grating where N is an integer, wherein the grating is formed in at least one of the two layers above and below the active region; and
    a pair of electrodes for injecting carriers in the active layer so as to radiate the light, wherein at least one of the electrodes has a light emitting portion.

8. The semiconductor laser as set forth in claim 6, wherein the light emitting portion is an opening provided in the electrode.

9. The semiconductor laser as set forth in claim 8, wherein the semiconductor layers have a pair of first cladding layers sandwiching the active layer, an optical guide layer formed in the stripe regions, and a second cladding layer for burying the optical guide layer.

10. The semiconductor laser as set forth in claim 9, wherein the gratings are formed on the second cladding layer.

11. A semiconductor laser comprising:
    a substrate;
    a plurality of semiconductor layers being stacked on the substrate including, a two-dimensional light emitting region therein, the light emitting region having a plurality of stripe regions and gap regions each being formed between the stripe regions, the stripe regions being optically coupled to each other through the gap regions so as to emit collimated light in the vertical direction to the surface of the semiconductor layers, and the light emitting region including 2N-th order gratings therein, where N is an integer; and a pair of electrodes for making the light emitting region emit light.

12. The semiconductor laser as set forth in claim 11, wherein the locations of the gratings correspond to each of the gap regions.

* * * * *

UNITED STATES PATENT AND TRADEMARK OFFICE
CERTIFICATE OF CORRECTION

PATENT NO.   :   4,894,835
DATED        :   January 16, 1990
INVENTOR(S)  :   Kazuhisa Uomi, et al.

It is certified that error appears in the above-identified patent and that said Letters Patent is hereby corrected as shown below:

Claim 1, column 9, line 25, "strips" should be --stripe--.

Claim 1, column 9, line 31, the first occurrence of "the" should be --and--.

Claim 3, column 9, line 38, "th" should be --the--.

Claim 6, column 9, line 47 through column 10, line 9 should be deleted.

Insert new claim 13 as follows:

13. The semiconductor laser as set forth in claim 7, wherein the electrode has a transparent portion so as to form the light emitting portion.

Signed and Sealed this

Twenty-fifth Day of December, 1990

Attest:

HARRY F. MANBECK, JR.

*Attesting Officer*    *Commissioner of Patents and Trademarks*